United States Patent
Brennan et al.

(10) Patent No.: US 8,352,902 B2
(45) Date of Patent: Jan. 8, 2013

(54) IMPLEMENTING ROUTING FIRST FOR RAPID PROTOTYPING AND IMPROVED WIRING OF HETEROGENEOUS HIERARCHICAL INTEGRATED CIRCUITS

(75) Inventors: Thomas Charles Brennan, Rochester, MN (US); Robert Francis Lembach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 12/902,343

(22) Filed: Oct. 12, 2010

(65) Prior Publication Data
US 2012/0089955 A1 Apr. 12, 2012

(51) Int. Cl.
*G06F 17/50* (2006.01)
(52) U.S. Cl. ........ 716/138; 716/129; 716/130; 716/122; 716/123; 716/132
(58) Field of Classification Search .................. 716/138, 716/129, 130, 123, 132, 122
See application file for complete search history.

(56) References Cited

U.S. PATENT DOCUMENTS

| 6,260,182 | B1 * | 7/2001 | Mohan et al. | 716/121 |
| 6,295,634 | B1 * | 9/2001 | Matsumoto | 716/126 |
| 6,629,302 | B2 * | 9/2003 | Miura et al. | 716/119 |
| 6,779,072 | B1 * | 8/2004 | Sauder et al. | 711/1 |
| 2007/0256044 | A1 * | 11/2007 | Coryer et al. | 716/13 |
| 2011/0023005 | A1 * | 1/2011 | Tsubamoto | 716/137 |

FOREIGN PATENT DOCUMENTS

JP 2004139570 A * 5/2004

* cited by examiner

*Primary Examiner* — Phallaka Kik
(74) *Attorney, Agent, or Firm* — Joan Pennington

(57) ABSTRACT

A method, system and computer program product are provided for implementing routing first for rapid prototyping and improved wiring of heterogeneous hierarchical integrated circuit chips. Placement for each of a plurality of random logic macros (RLMs) is identified. Predefined wiring shapes are created for each of the identified RLMs. Full chip wire routing is defined responsive to the created predefined wiring shapes for each of the identified RLMs.

15 Claims, 8 Drawing Sheets

US 8,352,902 B2

IMPLEMENTING ROUTING FIRST FOR RAPID PROTOTYPING AND IMPROVED WIRING OF HETEROGENEOUS HIERARCHICAL INTEGRATED CIRCUITS

FIELD OF THE INVENTION

The present invention relates generally to the data processing field, and more particularly, relates to a method, system and computer program product for implementing routing first for rapid prototyping and improved wiring of heterogeneous hierarchical integrated circuit chips.

DESCRIPTION OF THE RELATED ART

Modern integrated circuits are created in a hierarchical manner. The entire chip is divided into "mini-chips" otherwise known as random logic macros (RLMs).

The task of layout or physical design of integrated circuits is difficult with large numbers of people involved and many constraints. For example, the desires of the RLM designer may not match the desires of the chip level designer, for example, in the size and aspect ratio of the RLM.

Added complications are that signals can only travel a limited length before the signal degrades. For example, a signal in current technologies may only travel 1 mm. Another constraint is that the schedule may force the start of the design without internal logic available for some or even all of the RLMs, although the external ports or pins are available.

A need exists for an efficient and effective mechanism to implement rapid prototyping and improved wiring of heterogeneous hierarchical integrated circuit chips.

SUMMARY OF THE INVENTION

A principal aspect of the present invention is to provide a method, system and computer program product for implementing routing first for rapid prototyping and improved wiring of heterogeneous hierarchical integrated circuit chips. Other important aspects of the present invention are to provide such method, system, and computer program product substantially without negative effects and that overcome many of the disadvantages of prior art arrangements.

In brief, a method, system and computer program product are provided for implementing routing first for rapid prototyping and improved wiring of heterogeneous hierarchical integrated circuit chips. Placement for each of a plurality of random logic macros (RLMs) is identified. Predefined wiring shapes are created for each of the identified RLMs. Full chip routing is defined responsive to the created predefined wiring shapes for each of the identified RLMs.

In accordance with features of the invention, logic design for the RLMs is provided. Then ports are assigned at within the predefined wiring shapes at selected locations.

In accordance with features of the invention, the predefined wiring shapes include a hollow ring of pins around a prototype RLM outline. For example, a solid metallization level pin, such as a third metallization level (M3) pin on the entire north and south edge of the prototype RLM outline is created and a solid M4 pin on the entire east and west edge of the prototype RLM outline created. This allows a full chip routing to be rapidly performed and then the actual ports are snapped to the intersection of the wires and location of intersection at the RLM edge after the logic design for the RLMs is created.

In accordance with features of the invention, the predefined wiring shapes include a wiring triangle at each of the corners of the RLM. The corners of each RLM outline are reserved for the chip level. The wiring triangle size of the corners is selected based upon a maximum signal length for each given plane.

In accordance with features of the invention, the enhanced wiring allocation is enabled while timing problems or degraded signal quality, such as slew from long signals is avoided, which is typically created and detected late in conventional design methods.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product for implementing routing first for rapid prototyping and improved wiring of heterogeneous hierarchical integrated circuit chips. The invention provides enhanced wiring allocation, substantially avoiding timing problems and signal slew problems.

Figure 1:
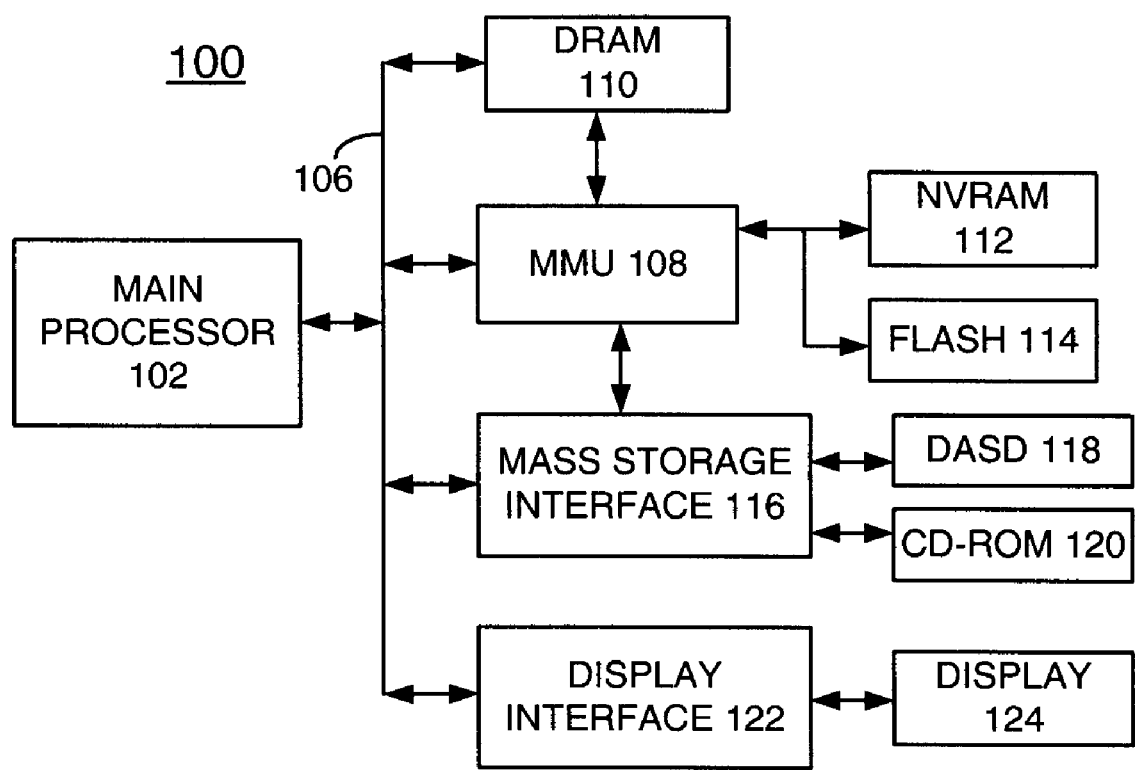
FIGS. 1 and 2 are block diagram representations illustrating an example computer system and operating system for implementing routing first for rapid prototyping and improved wiring of heterogeneous hierarchical integrated circuit chips in accordance with the preferred embodiment.
Figure 2:
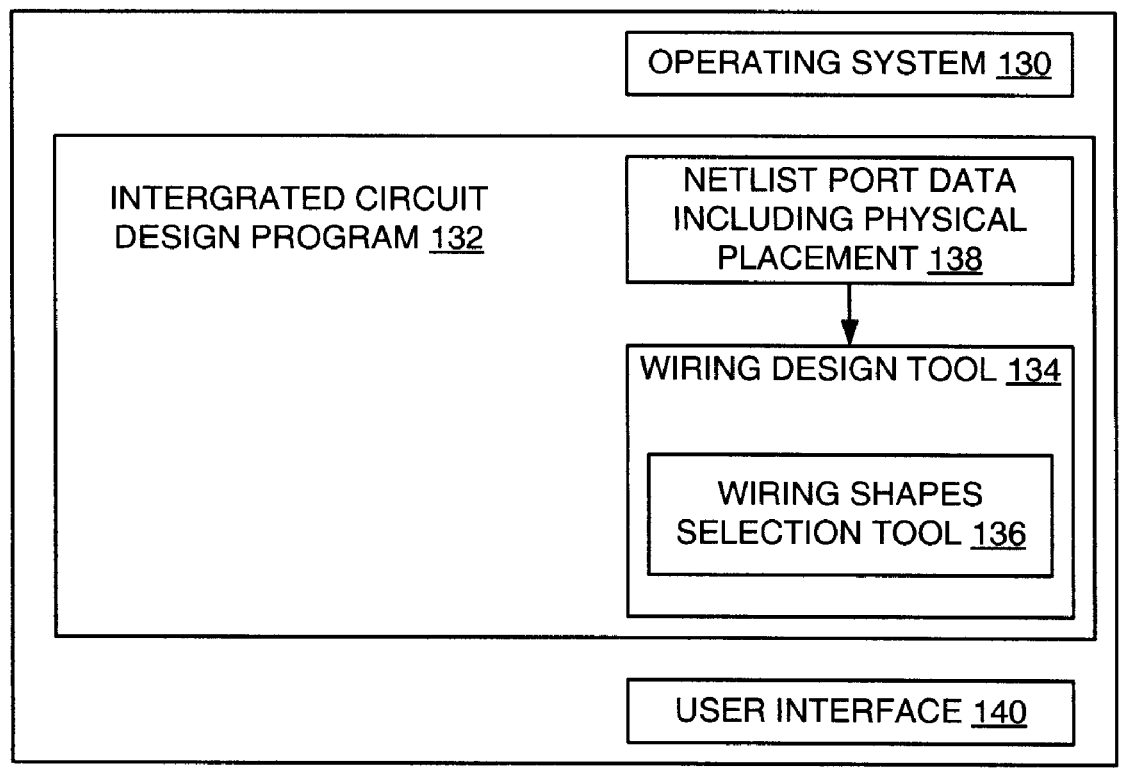

Referring now to the drawings, in FIGS. 1 and 2 there is shown a computer system generally designated by the reference character 100 for implementing enhanced routing first for rapid prototyping and improved wiring of heterogeneous hierarchical integrated circuit chips in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an integrated circuit design program 132, a wiring design tool 134 and a wiring shapes selection tool 136 of the preferred embodiment, netlist data including physical placement 138 describing physical placement of the random logic macros (RLMs) to be connected, and a user interface 140.

Various commercially available computers can be used for computer system 100. CPU 102 is suitably programmed by the wiring design tool 134 and wiring shapes selection tool 136 to execute the flowchart of FIG. 3 for implementing enhanced routing first for rapid prototyping and improved wiring of heterogeneous hierarchical integrated circuit chips in accordance with the preferred embodiment.

Figure 3:
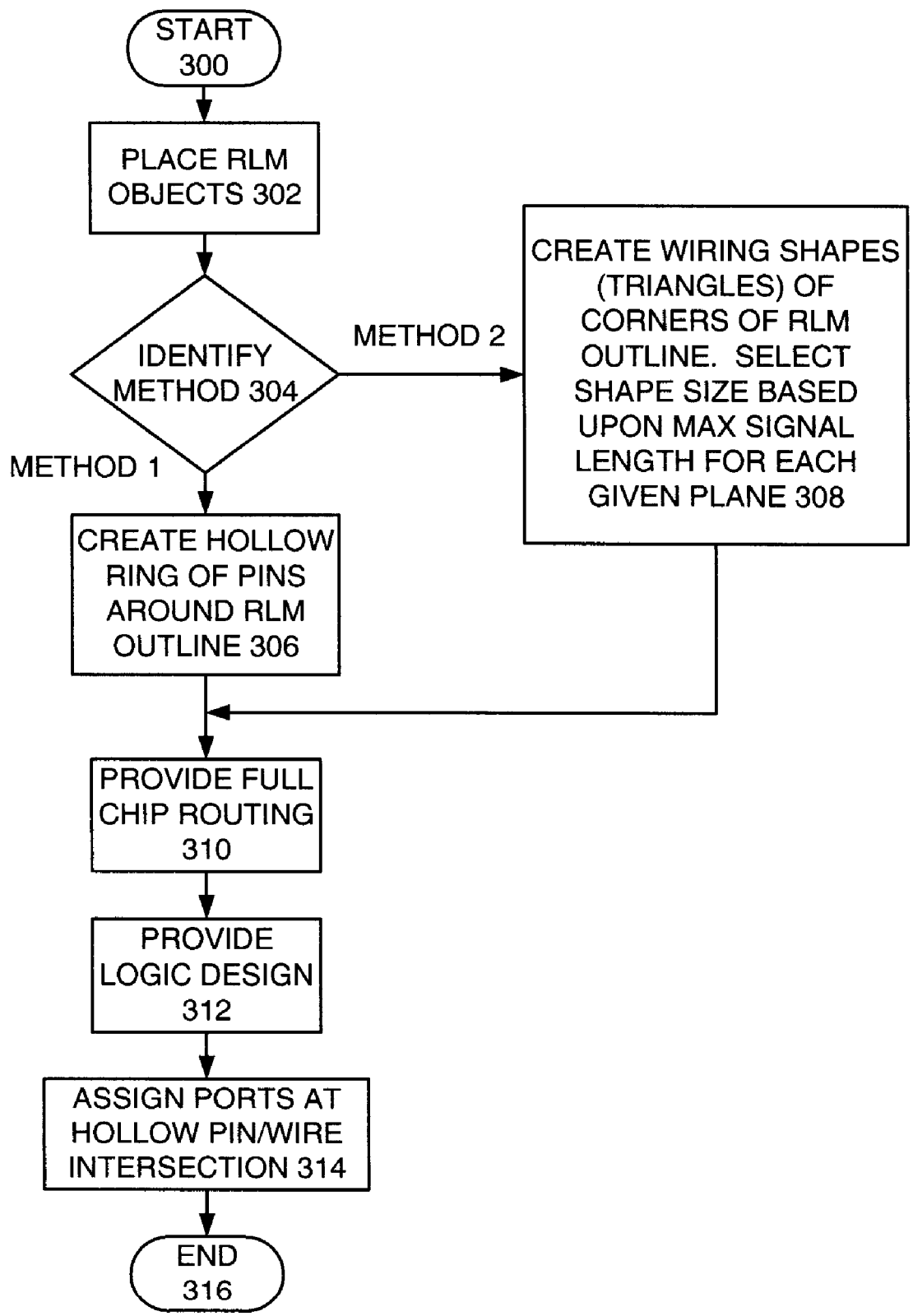
FIG. 3 is a flow chart illustrating exemplary sequential steps for implementing routing first for rapid prototyping and improved wiring of heterogeneous hierarchical integrated circuit chips in accordance with the preferred embodiment.

Referring now to FIG. 3, there are shown exemplary sequential steps for implementing routing first for rapid prototyping and improved wiring of heterogeneous hierarchical integrated circuit chips in accordance with the preferred embodiment starting at a block 300. Placement for each of a plurality of random logic macros (RLMs) is identified as indicated at a block 302.

In accordance with features of the invention, predefined wiring shapes are created for each of the identified RLMs. As indicated at a decision block 304, a first or a second method for creating wiring shapes is identified.

In a first method, the predefined wiring shapes include a hollow ring of pins that are created around a prototype RLM outline as indicated at a block 306. For example, a solid metallization level pin, such as a third metallization level (M3) pin on the entire north and south edge of the prototype RLM outline is created and a solid M4 pin on the entire east and west edge of the prototype RLM outline created. This allows a full chip routing to be rapidly performed and then the actual ports are snapped to the intersection of the wires and location of intersection at the RLM edge after the logic design for the RLMs is created.

In a second method, the predefined wiring shapes include a wiring triangle created at each corners of the RLMs as indicated at a block 308. The corners of the RLM outlines are reserved for wiring at the chip design level. The wiring triangle size of the corners is selected based upon a maximum signal length for each given plane.

In accordance with features of the invention, full chip routing is defined responsive to the created predefined wiring shapes for each of the identified RLMs as indicated at a block 310. Logic design for the RLMs is provided as indicated at a block 312. Ports are assigned at within the predefined wiring shapes at selected locations as indicated at a block 314. The operations are completed as indicated at a block 316.

Referring now to FIGS. 4, 5, 6 and 7, there are shown exemplary sequential steps for implementing routing first for rapid prototyping and improved wiring of heterogeneous hierarchical integrated circuit chips in accordance with the preferred embodiment.

Figure 4:
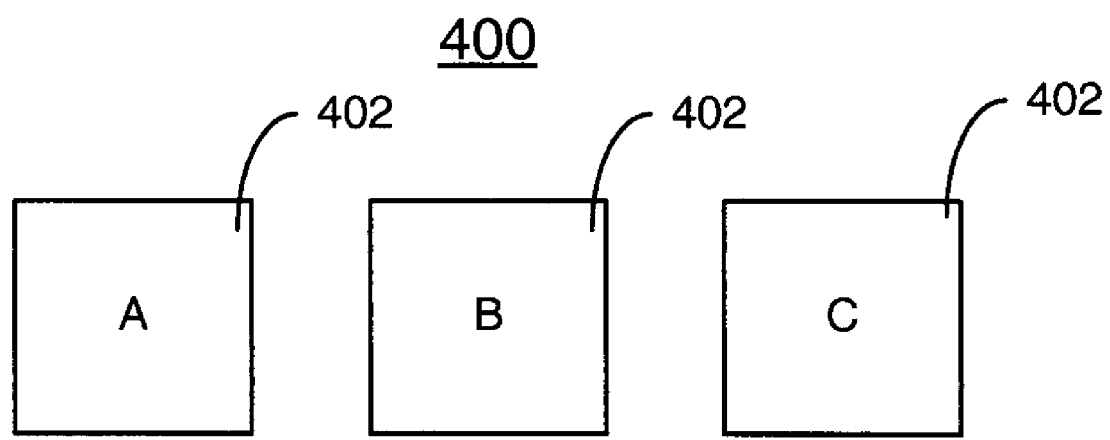
FIGS. 4, 5, 6 and 7 illustrate exemplary sequential steps for implementing routing first for rapid prototyping and improved wiring of heterogeneous hierarchical integrated circuit chips in accordance with the preferred embodiment.

In FIG. 4, an initial sequential step generally designated by the reference character 400 is shown in accordance with the preferred embodiment. A plurality of random logic macros (RLMs) 402 or RLM outlines A, B, C, 402 are placed.

Figure 5:
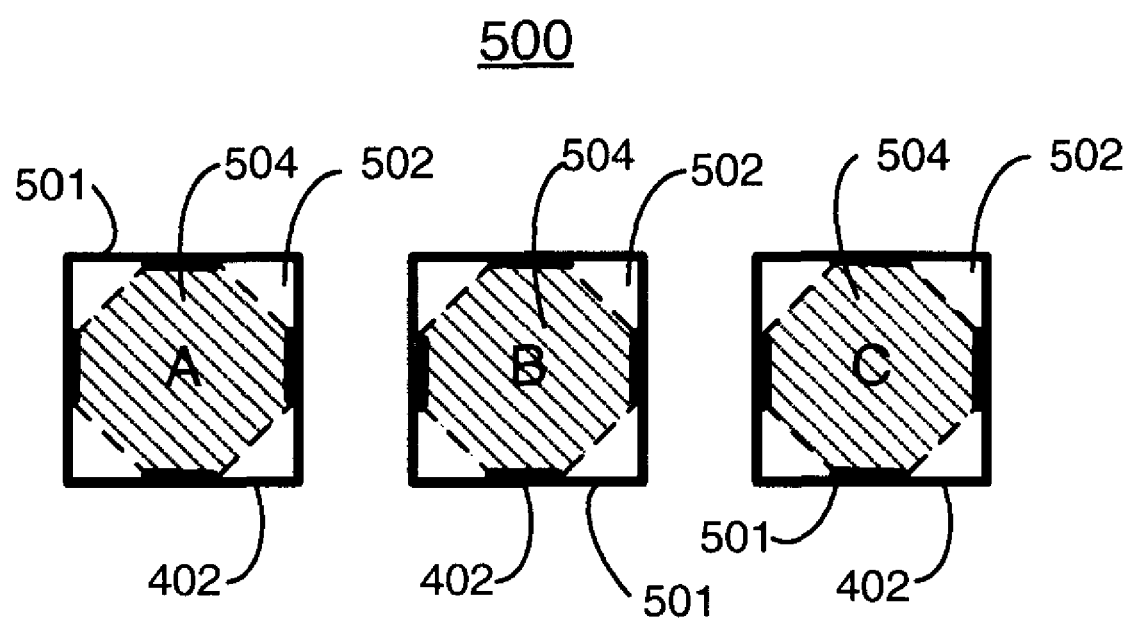

In FIG. 5, a next sequential step generally designated by the reference character 500 is shown in accordance with the preferred embodiment. Hollow coincident pins 501 within a plurality of wiring shapes 502 are added around RLM outlines A, B, C, 402 with interior areas 504 reserved for logic design.

Figure 6:
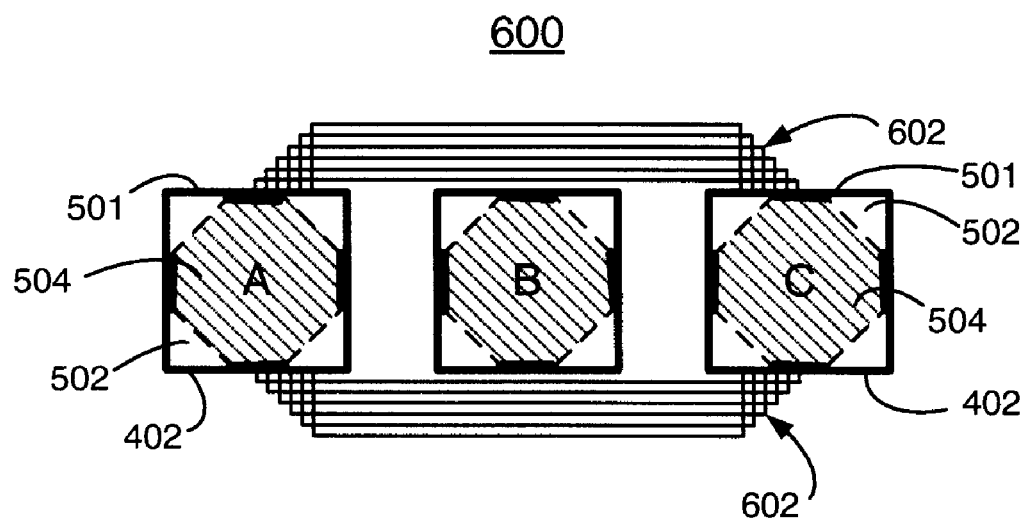

In FIG. 6, a next sequential step generally designated by the reference character 600 is shown in accordance with the preferred embodiment. Wiring 602 is routed to the hollow coincident pins 501 provided within the RLM outlines A, and C, 402.

Figure 7:
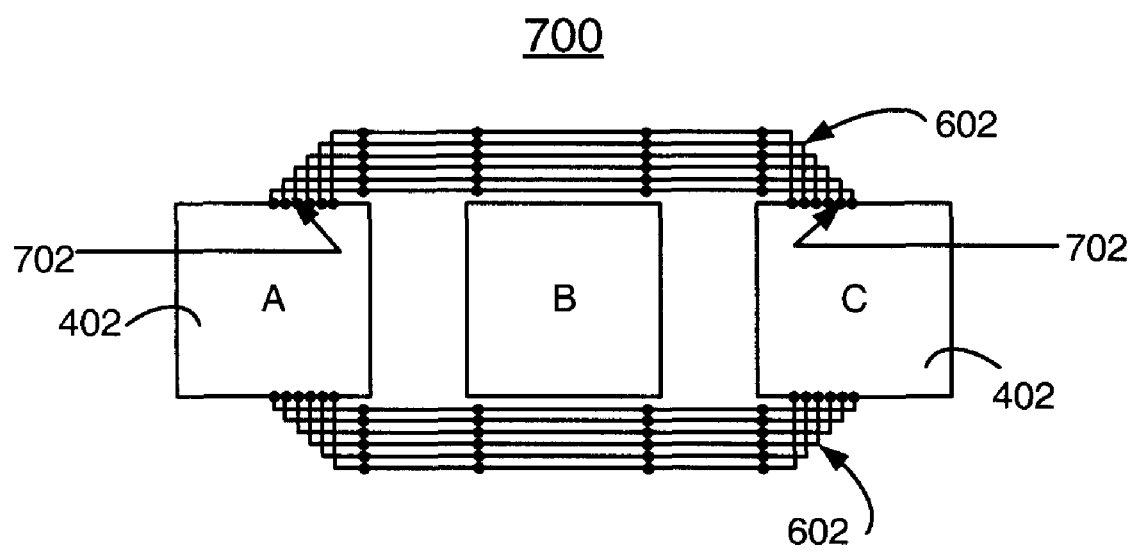

In FIG. 7, a next sequential step generally designated by the reference character 700 is shown in accordance with the preferred embodiment that is performed after the logic design is provided within the RLM outlines A, and C, 402. A plurality of ports 702 is assigned at intersections of hollow coincident pins 501 and wiring 602 within the RLM outlines A, and C, 402.

Figure 8:
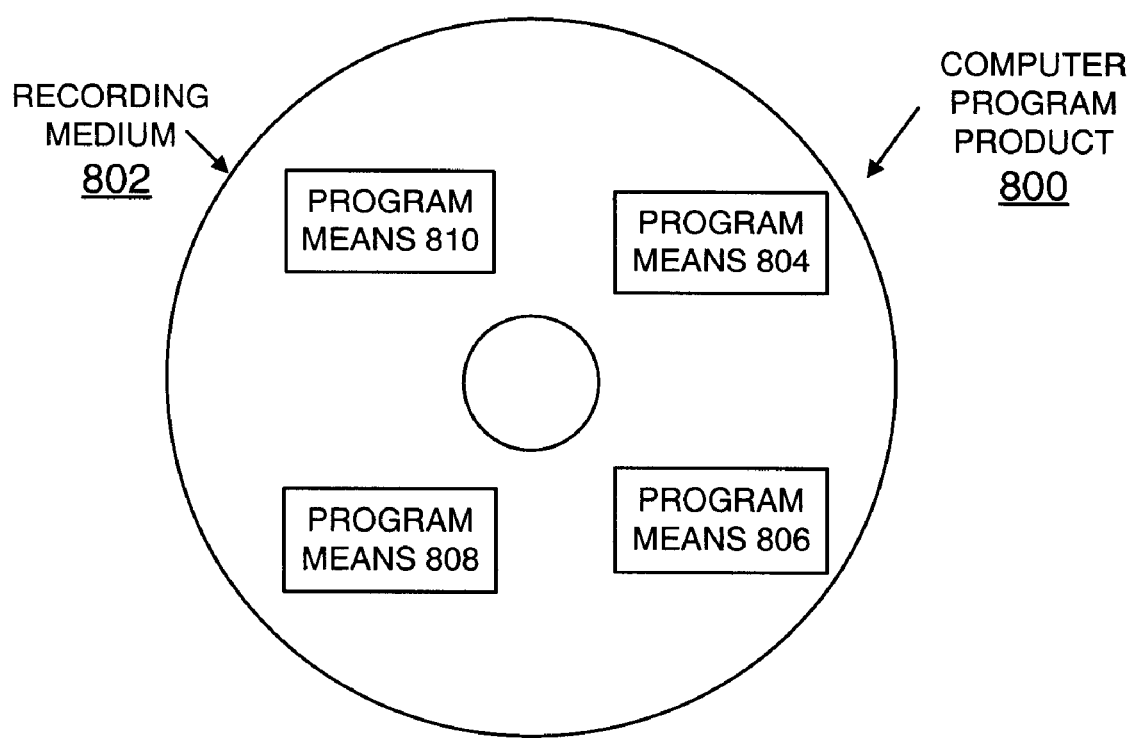
FIG. 8 is a block diagram illustrating a computer program product in accordance with the preferred embodiment.

Referring now to FIG. 8, an article of manufacture or a computer program product 800 of the invention is illustrated. The computer program product 800 includes a recording medium 802, such as, a floppy disk, a high capacity read only memory in the form of an optically read compact disk or CD-ROM, a tape, or another similar computer program product. Recording medium 802 stores program means 804, 806, 808, 810 on the medium 802 for carrying out the methods for implementing enhanced routing first for rapid prototyping and improved wiring of heterogeneous hierarchical integrated circuit chips of the preferred embodiment in the system 100 of FIGS. 1 and 2.

A sequence of program instructions or a logical assembly of one or more interrelated modules defined by the recorded program means 804, 806, 808, 810, direct the computer system 100 for implementing enhanced routing first for rapid prototyping and improved wiring of heterogeneous hierarchical integrated circuit chips of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing wiring for heterogeneous hierarchical integrated circuit chips comprising:
   identifying placement for each of a plurality of random logic macros (RLMs);
   creating predefined wiring shapes for each of the identified RLMs including creating a wiring triangle at each corner of each of the identified RLMs; and
   defining, using a computer, chip wire routing responsive to the created predefined wiring shapes for each of the identified RLMs.

2. The computer-implemented method as recited in claim 1 wherein creating predefined wiring shapes for each of the identified RLMs includes creating a hollow ring of pins around an outline of each of the identified RLMs.

3. The computer-implemented method as recited in claim 1 wherein creating a wiring triangle at each corner of each of the identified RLMs includes selecting a wiring triangle size of each said corner based upon a maximum signal length for each plane.

4. The computer-implemented method as recited in claim 1 includes providing a logic design for each of the identified RLMs.

5. The computer-implemented method as recited in claim 4 includes assigning ports within the created predefined wiring shapes for each of the identified RLMs with said defined chip wire routing responsive to said logic design.

6. A system as for implementing wiring for heterogeneous hierarchical integrated circuit chips comprising:
   a processor,
   an integrated circuit design program tangibly embodied in a machine readable medium used in the integrated circuit design process, said integrated circuit design program including a wiring design tool and a wiring shapes selection tool,
   said processor using said wiring design tool, identifying placement for each of a plurality of random logic macros (RLMs); and
   said processor using said wiring shapes selection tool, creating predefined wiring shapes for each of the identified RLMs including said processor creating a wiring triangle at each corner of each of the identified RLMs; and said processor defining chip wire routing responsive to the created predefined wiring shapes for each of the identified RLMs.

7. The system as recited in claim 6 wherein said processor using said wiring shapes selection tool, creating predefined wiring shapes for each of the identified RLMs includes said processor creating a hollow ring of pins around an outline of each of the identified RLMs.

8. The system as recited in claim 6 wherein said processor creating a wiring triangle at each corner of each of the identified RLMs includes said processor selecting a wiring triangle size of each said corner based upon a maximum signal length for each plane.

9. The system as recited in claim 6 includes said processor providing a logic design for each of the identified RLMs.

10. The system as recited in claim 9 includes said processor assigning ports within the created predefined wiring shapes for each of the identified RLMs with said defined chip wire routing responsive to said logic design.

11. An integrated circuit design computer program for implementing wiring for heterogeneous hierarchical integrated circuit chip design in a computer system, said computer program product tangibly embodied in a non-transitory machine readable medium used in the integrated circuit design process, said integrated circuit design computer program product including a wiring design tool and a wiring shapes selection tool, said integrated circuit design computer program product including instructions executed by the computer system to cause the computer system to perform the steps of:
   identifying placement for each of a plurality of random logic macros (RLMs);
   creating predefined wiring shapes for each of the identified RLMs including creating a wiring triangle at each corner of each of the identified RLMs; and
   defining chip wire routing responsive to the created predefined wiring shapes for each of the identified RLMs.

12. The integrated circuit design computer program product as recited in claim 11 wherein creating predefined wiring shapes for each of the identified RLMs includes creating a hollow ring of pins around an outline of each of the identified RLMs.

13. The integrated circuit design computer program product as recited in claim 11 wherein creating a wiring triangle at each corner of each of the identified RLMs includes selecting a wiring triangle size of each said corner based upon a maximum signal length for each plane.

14. The integrated circuit design computer program product as recited in claim 11 includes providing a logic design for each of the identified RLMs.

15. The integrated circuit design computer program product as recited in claim 14 includes assigning ports within the created predefined wiring shapes for each of the identified RLMs with said defined chip wire routing responsive to said logic design.

* * * * *